United States Patent [19]

Philipp

[11] 4,438,404
[45] Mar. 20, 1984

[54] SIGNAL SAMPLING SYSTEM

[75] Inventor: Harald Philipp, Aloha, Oreg.

[73] Assignee: Tektronix, Inc., Beaverton, Oreg.

[21] Appl. No.: 337,041

[22] Filed: Jan. 4, 1982

[51] Int. Cl.$^3$ .................................. H03K 5/13; 17/28
[52] U.S. Cl. ................................ 328/63; 328/130.1; 307/601
[58] Field of Search ............... 307/228, 601; 328/63, 328/130.1

[56] References Cited

U.S. PATENT DOCUMENTS

| | | | |
|---|---|---|---|
| 4,121,164 | 10/1978 | Feucht | 307/228 |
| 4,204,173 | 5/1980 | Aschwanden | 307/228 |
| 4,223,267 | 9/1980 | Sartorius et al. | 307/601 |

Primary Examiner—John S. Heyman
Attorney, Agent, or Firm—George T. Noe

[57] ABSTRACT

A signal sampling system includes a combined digital and analog acquisition time base for accurately sampling and displaying an extremely short duration electrical event superimposed on a long time duration signal. The signal sampling system of the present invention is intended for use in stimulus-response situations, and both stimulus and response signals are synchronized with the clock of the digital portion of the time base. The system may be operated under microprocessor control, providing both flexibility and programmability, in turn permitting not only acquisition of waveforms that start and stop at arbitrary points with extreme precision, but signal averaging or smoothing as well.

12 Claims, 11 Drawing Figures

SIGNAL SAMPLING SYSTEM

BACKGROUND OF THE INVENTION

Many measurement situations arise in which it is desired to accurately display the waveform of an extremely short duration electrical event superimposed on a long time duration signal. An example of such a situation is the measurement of a response pulse having a width of less than 100 nanoseconds which occurs hundreds of microseconds after stimulus of some type, such as occur in radar, sonar, time-domain reflectometry, and certain network analyzer situations.

Attempted prior art solutions to this measurement problem have been unsatisfactory. Conventional delayed-sweep oscilloscopes simply do not have the resolution, triggering accuracy, or time-base stability for such precise measurements. It is essential that the response signal be synchronized with the stimulus signal and with the timing signal of the measuring circuit in order to provide signal acquisition with any kind of precision. Thus, in stimulus-response situations of the type mentioned above, it is desirable that the stimulus be generated in response to a start signal from the acquisition circuit's time base.

Conventional analog sampling techniques do not provide the high resolution required for faithful signal replication because of temporal inaccuracies resulting in a phenomena known as jitter—the smearing or slewing of displayed acquired data. Since jitter is typically expressed as a percentage of the overall time delay from the time base start to the point at which a sample is taken, that percentage may actually exceed the window of an extremely narrow pulse to be acquired a comparatively long time after stimulus, causing total destruction of any meaningful data.

A digital approach can aid the solution of this problem by allowing the use of a stable crystal-controlled clock timebase to act as a basis for generating the necessary timing signals. Such a time-base may have jitter percentages many orders of magnitude better than those obtainable with an analog system. However, a problem associated with such a digital timebase is that since the minimum sampling period is defined by the period of the clock pulse, extremely narrow pulses falling between successive sample points will be lost. For example, for a 100-megahertz clock, no better than one part in $10^8$, or 10 nanoseconds, can be resolved. Furthermore, the use of such a high-speed clock over the entire waveform requires the use of high-speed circuitry, not to mention the excess consumption of energy. Also, since memory space may be limited, another associated problem is deciding which samples to store and which ones to discard.

SUMMARY OF THE INVENTION

In accordance with the present invention, there is provided a signal sampling system capable of accurately replicating an extremely short-duration electrical event occurring comparatively long time after a stimulus. The preferred embodiment is intended for use in an optical time-domain reflectometer (TDR); however, the general principles described herein may be used in any stimulus-response measurement situation, including radar, sonar, electrical TDR apparatus, and network analyzers.

The acquisition time base includes a precision delay generator having a digital delay portion which generates clock pulses in synchronism with a signal to be measured, and an analog delay portion which interpolates between clock edges to generate sampling strobes at preselected discrete time points. The digital delay generator includes a crystal-controlled clock for precise timing, and may be used to initiate the stimulus pulse to thereby ensure perfect synchronism with the stimulus and response signals. The analog delay generator includes a comparison circuit for comparing discrete voltage levels with an internally-generated high-speed ramp voltage to generate sampling strobes, and the analog delay generator is activated after a selectable number of clock edges have been produced by the digital delay generator. Both the number of clock pulses for the digital delay generator and the discrete comparison voltage levels for the analog delay generator may be selected under the control of a control logic unit, such as a microprocessor. Thus, for repetitive response signals, not only may a complete series of points be acquired at evenly-spaced intervals to provide a complete waveform, but a single point (or partial series of points) may be acquired repetitively and the average taken to thereby provide a filtering effect or a smoothing (boxcar averaging) effect.

It is therefore one object of the present invention to provide a signal sampling system for accurately sampling extremely short-duration electrical events superimposed on a long time duration signal.

It is another object to provide a signal sampling system having a combined digital and analog acquisition timebase in which the analog portion interpolates between clock edges produced by the digital portion.

It is a further object to provide a signal sampling system having an acquisition time base which operates in precise synchronism with repetitive stimulus pulses, wherein the timebase may generate the stimulus pulses or may be triggered by an event related to the signal that is to be sampled.

It is an additional object to provide a signal sampling system having a combined digital and analog acquisition time base which is programmable.

It is still another object to provide a signal sampling system in which temporal inaccuracies such as jitter and drift are virtually eliminated.

It is still a further object to provide a flexible signal sampling system capable of signal averaging or smoothing and forward or reverse acquisition from a precisely selectable delay point.

Other objects, advantages, and features of the present invention will become apparent to those having ordinary skill in the art upon a reading of the following description when taken in conjunction with the accompanying drawings.

DETAILED DESCRIPTION OF THE INVENTION

Figure 1:
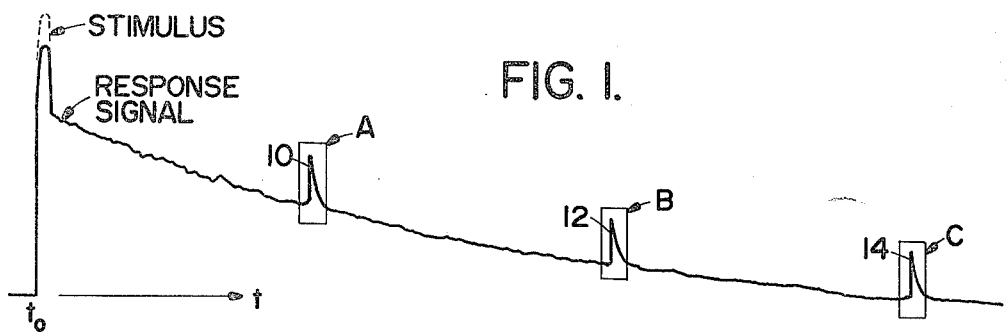
FIG. 1 is a graphic display of a response signal of long duration having short-duration phenomena of interest therealong.

To aid in understanding the method and apparatus of the present invention, it will be helpful to consider the measurement problem. FIG. 1 is a graphic display of a response signal of long duration having short-duration phenomena of interest therealong. This response signal may be considered repetitive in the sense that a stimulus signal (shown by a dashed line) may be produced at a pulse repetition frequency (PRF) which allows complete time-out of a response period between stimulus pulses. For this discussion, let us suppose that the response signal of FIG. 1 is that of an optical fiber being measured by a TDR. The stimulus, which in this case is a light impulse introduced into the optical fiber, is shown by a dashed line at time $t_0$. Substantially contemporaneously therewith, the response signal begins, and as shown is a logarithmic compression of the actual reflected signal from the fiber so that the response signal is a graphic display of signal strength in decibels (dB) versus distance along the fiber. The pulses 10 and 12 occurring along the response signal may indicate splices in the fiber, while pulse 14 may indicate the end of the fiber. The pulses 10, 12, and 14 are selected as being of interest for closer examination, and are thus shown enclosed by boxes A, B, and C, respectively, for purposes of illustration.

Figure 2A:
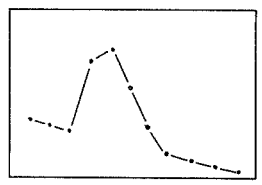
FIGS. 2A–2C illustrate resulting displays of the phenomena of interest of FIG. 1 using prior-art analog sampling techniques.
Figure 2B:
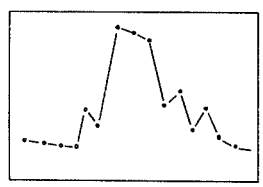
Figure 2C:
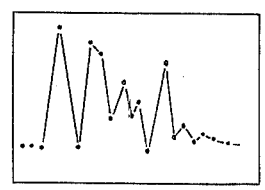

FIGS. 2A, 2B, and 2C illustrate the jitter problem associated with attempting to sample the pulses 10, 12, 14, respectively, using a conventional analog sampling method. Since jitter may be expressed as a percentage of the overall time delay from $t_0$ to the point at which a sample is taken, the farther from time $t_0$, the greater the jitter. In FIG. 2A, pulse 10 is slightly distorted, but still intelligible. In FIG. 2B, pulse 12 shows considerable distortion as the jitter becomes substantially significant. In FIG. 2C, which represents a display of acquired waveform 14, the pulse is generally unintelligible due to the jitter.

Figure 3:
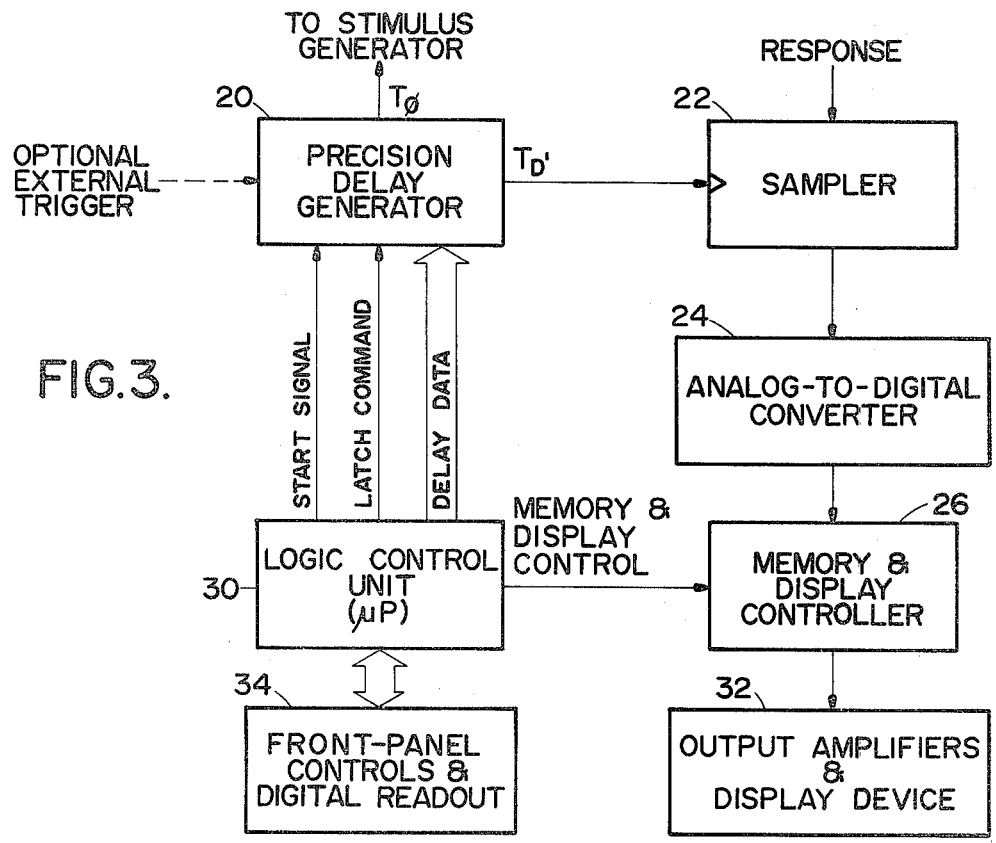
FIG. 3 is a block diagram of a signal sampling system in accordance with the present invention.

The present invention accurately replicates a short-duration electrical event occurring on a long time duration waveform by means of a combined digital-analog delaying technique. FIG. 3 shows a block diagram of a signal sampling system in accordance with the present invention. Basically, a precision delay generator 20 develops timing pulses, one of which is used to generate a stimulus, such as a light impulse to be sent down an optical fiber, and another of which is used to generate a sampling strobe $T_D'$ in precise time relationship with the stimulus. A sampler 22 receives the sampling strobe $T_D'$ and takes a sample of the incoming response signal, which may suitably be reflections of the stimulus pulse returning from the optical fiber. The sampler 22 may be a conventional sample-and-hold circuit which captures an analog sample of the response signal when the sample strobe $T_D'$ arrives. The analog sample is converted to a digital value by a conventional analog-to-digital converter 24. The digital value is then transferred to a memory 26, the address of which is selected by a logic control unit 30, which may suitably be a microprocessor. An output amplifier and display device 32 is connected to the memory 26, which also includes display controller logic, for subsequent display of the recorded samples. A front-panel control and digital readout unit 34 is connected to the microprocessor 30 via a conventional bus.

Basically, the system in accordance with the commercial embodiment is operated in an equivalent-time sampling fashion in which one sample per repetitive sweep is collected and stored in memory. The microprocessor 30 programs the delay in the timebase. The timebase, in turn, controls the sampler 22 at the end of the elapsed time delay by causing a sample of the input signal to be taken. By repeating the process, and by changing the programmed delay incrementally (or decrementally) with each acquired point, the entire waveform of the desired portion of the response signal may be captured and stored in memory.

Figure 4:
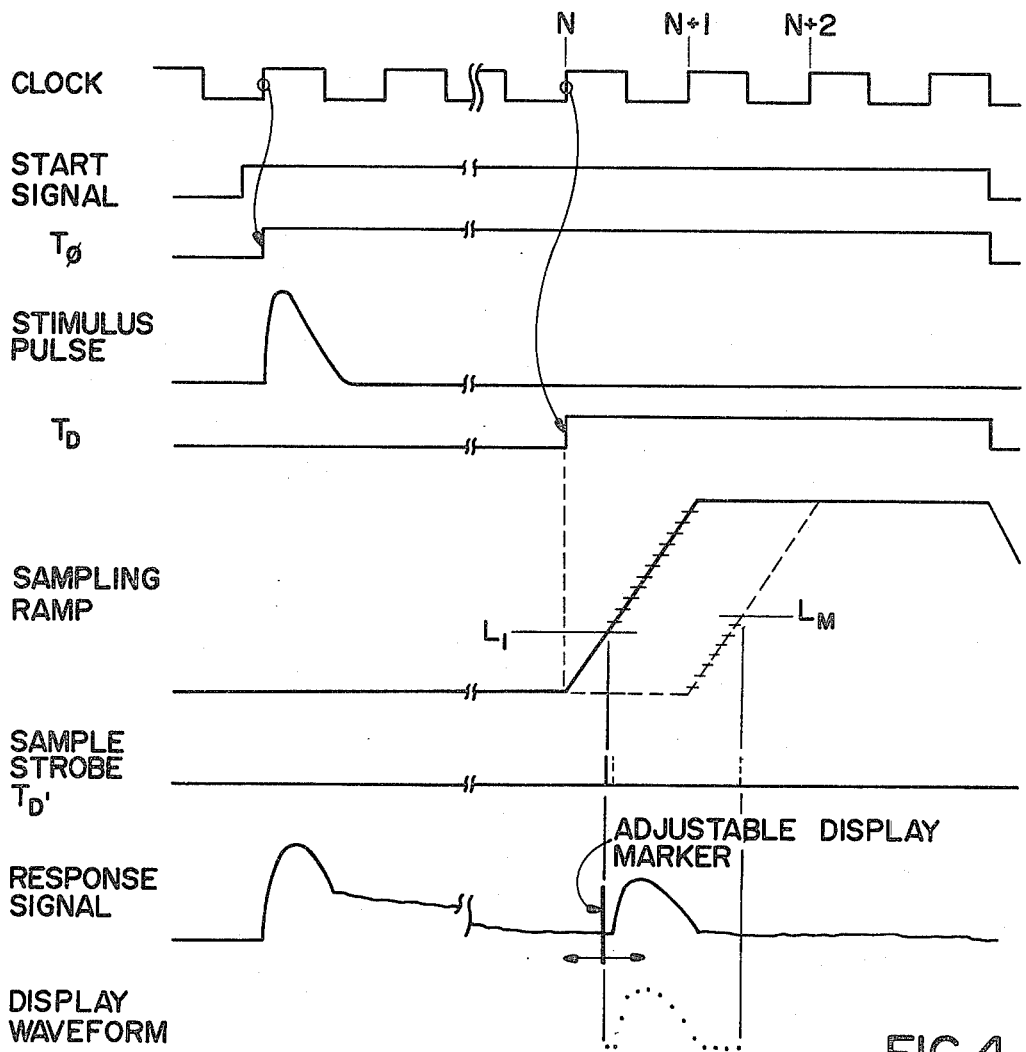
FIG. 4 is a waveform ladder diagram for explaining the operation of the precision delay generator of FIG. 3.
Figure 5:
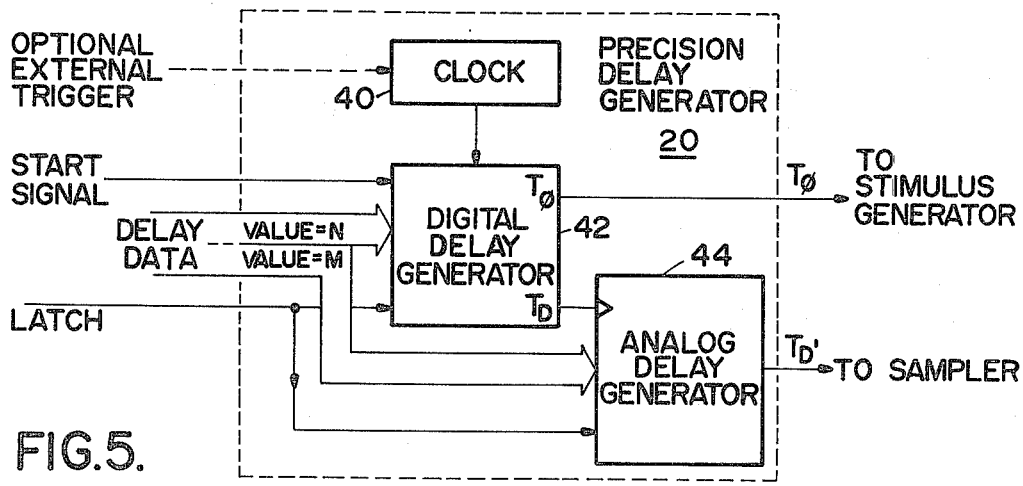
FIG. 5 is a block diagram of the precision delay generator of FIG. 3 showing the relationship between the digital delay generator and analog delay generator portions thereof.

Overall operation of the system of FIG. 3 may best be understood from the timing ladder diagram of FIG. 4 and the block diagram of the precision delay generator 20 shown in FIG. 5. The precision delay generator 20 includes a stable crystal-controlled clock 40, a digital delay generator 42, and an analog delay generator 44. In the commercial embodiment of the present invention, clock 40 has a clock rate of 20 megahertz (clock period of 50 nanoseconds), allowing relaxed speed requirements of the digital delay generator 42. Actually, within the constraints of a given design, the clock frequency may be purely a matter of design choice.

The pulse repetition frequency of the stimulus pulses may be programmed into the microprocessor 30, which sends start signals to the digital delay generator in conformance therewith. That is, for a given sampling system, the pulse repetition frequency must allow time between stimulus pulses for all of the response signals to be received before a new stimulus pulse is generated. Let us assume that the present system is designed to allow a propagation time of 200 microseconds down the length of an optical fiber. That means that a complete timeout of 400 microseconds is required between stimulus pulses since 200 microseconds is required for the stimulus pulse to travel down the fiber, and 200 microseconds is required for a reflection to travel back to the sampler. With a clock period of 50 nanoseconds, 8K clock pulses are required for complete time out, which in turn means that 13 binary bits (because $2^{13}=8,192$) are required to program the digital delay generator.

For the commercial embodiment, 0.2 nanoseconds resolution for interpolating between sample clock pulses was desired, so that 250 discrete points would need to be acquired over the 50-nanosecond interval. Therefore, 8 binary bits ($2^8=256$) are required to program the analog delay generator in this example.

The delay data generator line from the microprocessor 30 to the precision delay generator may therefore be 21 bits wide, with the 13 higher order bits connecting to the digital delay generator 42 and the 8 lower order bits connecting to the analog delay generator 44.

With these preliminary details understood, it now can be seen that to acquire a short-duration event of interest, it is necessary to program the digital delay generator 42 with N clock cycles using the 13 higher order bits of the 21-bit delay data signal, and to program the analog delay generator 44 with a value M, indicating a voltage comparison level for generating a sampling strobe, as will be seen later. The values N and M may be programmed if it is known where on the response signal certain phenomena is expected, or more likely, an adjustable display marker may be moved along a displayed complete or partial response signal to an area of interest, such as is shown in the bottom waveform of FIG. 4, and the microprocessor 30 may then convert the distance to values of N and M.

Once the delay data values of N and M are established, they are loaded into the precision delay generator and latched by a latch command signal from microprocessor 30. Thereafter, a start signal is sent to the digital delay generator portion 42, initiating a positive-going edge at $T_0$ which is sent to a stimulus generator to generate a stimulus pulse. At time $T_0$, the digital delay generator 42 begins to count clock cycles until the Nth clock edge arrives. At this point, a time delay signal $T_D$ is generated by the digital delay generator 42 and is utilized to trigger the analog delay generator 44. Thus, as can be seen in FIG. 4, at time $T_D$, a sampling ramp is initiated. The value M held in the analog delay generator 44 latch is converted by a digital-to-analog converter (DAC) to a discrete voltage level L. Let us assume that the level is $L_l$ as depicted. For convenience of describing the operation, this is the point selected by the adjustable display marker. When the sampling ramp passes through the comparison level $L_l$, a sample strobe $T_D'$ is generated and sent to the sampler 22 to acquire a waveform point. After timeout of the reflected response signal, the latch of the analog delay generator may be updated with a new value M, and the stimulus-response cycle repeated to acquire another discrete waveform point. This process may be repeated until all of the waveform points are acquired, since the response signal may be considered to be a repetitive signal as far as the sampler 22 is concerned.

There are several features to be noted about the flexibility of such a signal sampling system hereinabove described. One is that the end points of the acquired waveform, indicated by the comparison levels $L_l$ and $L_M$, may occur anywhere between clock cycles, and they are not limited to having to occur within a single clock period. The digital delay generator latch may be updated to N+1, or N+2, etc., starting the sampling ramp at those points, if necessary, to acquire the complete waveform desired. Furthermore, the actual acquisition does not need to begin at level $L_l$ and end at $L_M$. It could be just the reverse. Or acquisition could begin in the middle or the area of interest, with subsequent acquired points being filled in, working toward both ends. The reason for this flexibility is that the microprocessor knows the position of each point and may address the memory and display controller accordingly.

Another feature is that a filtering action may be achieved by acquiring several samples at the same point on successive repetitions of the response signal, and taking the average of these samples to arrive at a final value for display. By acquiring several adjacent points and averaging these (this is known in art as boxcar averaging), a smoothing effect may be achieved as well. Also, certain situations may arise in which it is desired to change the slope of the sample ramp to interpolate between several clock cycles, rather than just one as shown. And it may be desirable to acquire several or all points in one sweep as in a real-time sampling situation, as described in my earlier U.S. Pat. No. 4,283,713.

While it is preferable for the acquisition time base, i.e., the precision delay generator 20, to initiate the stimulus so that a precise time relationship is established between stimulus and response by using a single clock, it is possible that an external stimulus could be generated and an external trigger signal (shown by a dashed line in FIGS. 3 and 5) applied to precision delay generator. Any time mismatch between stimulus and a clock edge could be compensated by adjusting the start of the sampling ramp to provide an identical time mismatch, or by providing an identical mismatch between the response signal and a clock edge.

Figure 6A:
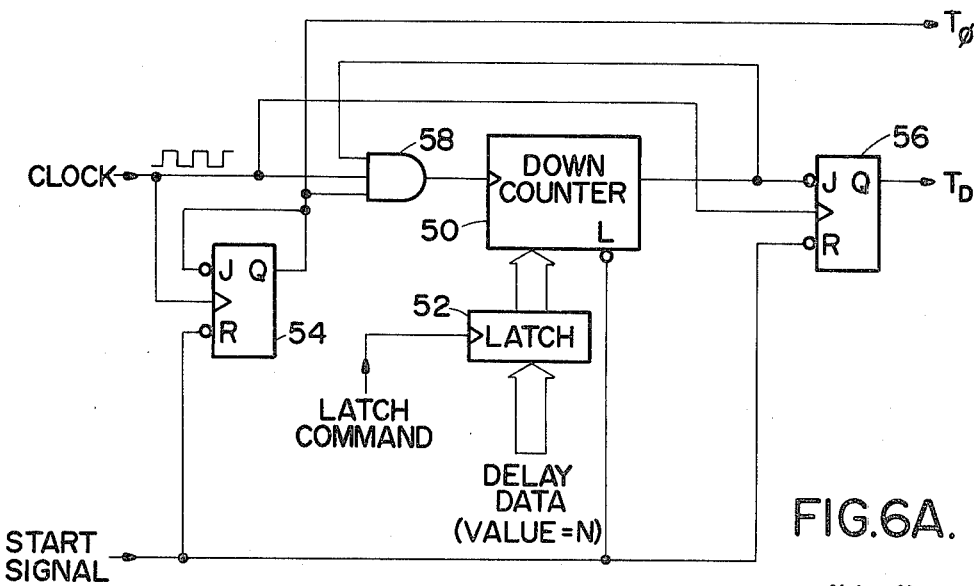
FIG. 6A is a schematic diagram of the digital delay generator.
Figure 6B:
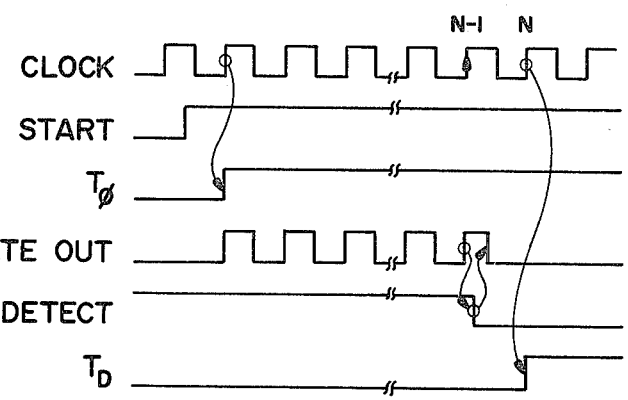
FIG. 6B is a series of waveforms showing the operation of the digital delay generator.

The details of the digital delay generator are shown in FIG. 6A, and the waveforms for explaining the operation thereof are shown in FIG. 6B. Basically, a presettable down counter 50 is utilized to count a predetermined number of clock pulses. The counter is programmed with the delay value N loaded via a latch 52. The output $T_0$ to a stimulus generator is provided by a first flip-flop 54 going to its active state, and the output $T_D$ to the analog delay generator is provided by a second flip-flop 56 going to its active state some time later. Refer to FIG. 6B. Initially, the start signal is low, holding both flip-flops 54 and 56 reset, and allowing the counter to be loaded with its preset value from latch 52. At some point in time, a start signal in the form of a positive-going edge is received, removing the reset hold from the flip-flops 54 and 56. The next positive-going clock edge toggles flip-flop 54, producing the positive-going $t_0$ signal. This high logic level is also applied to the inhibit input of flip-flop 54 to prevent further toggling. The clock signals are applied via an AND gate 58 to the clock input of counter 50. When the counter 50 counts down to the one-count, which corresponds to the Nth clock pulse minus one (N−1), the output of the counter goes from a high logical level to a low logic level, enabling flip-flop 56 and disabling AND gate 58. The next positive-going clock edge, which is the Nth one, toggles flip-flop 56, producing the positive-going $T_D$ signal. The digital delay generator is reset when the start signal goes low.

Figure 7:
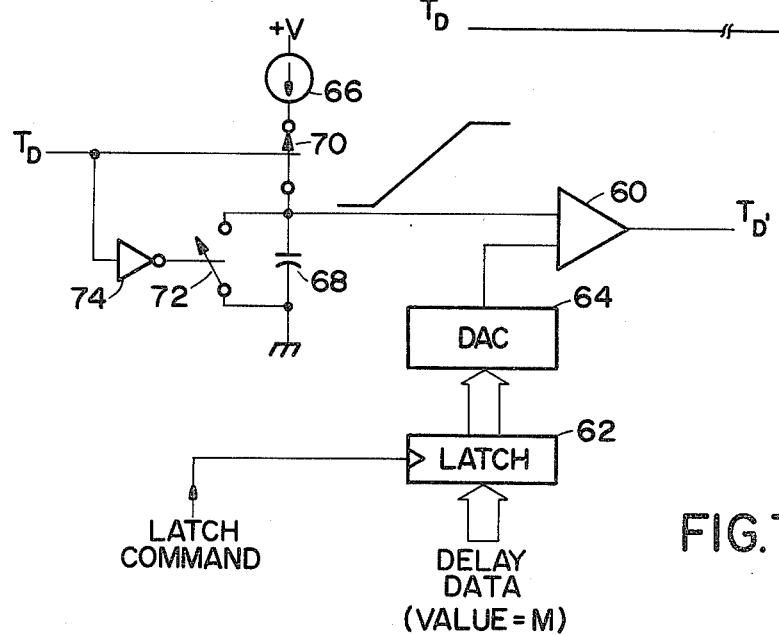
FIG. 7 is a schematic diagram of the analog delay generator.

The details of the analog delay generator are shown in FIG. 7. Here, the basic operation is that a comparator 60 compares discrete voltage levels applied from a latch 62 via a DAC 64 to one input thereof with a ramp voltage generated at the other input thereof, and generates the pulse edge $T_D'$ at the comparison point. The delay data from the microprocessor is loaded into latch 62 upon receipt of the latch command pulse. Upon receipt of the $T_D$ signal from the digital delay generator, current from constant current source 66 flows into capacitor 68 through a closed switch 70. The integrating function of capacitor 68 results in a linear ramp voltage thereacross. When the $T_D$ signal goes low as a result of flip-flop 56 being reset, switch 70 is opened and a switch 72 is closed to discharge capacitor 68. An inverting amplifier 74 ensures complementary behavior of the switches 70 and 72, which may suitably be high-speed transistors or the like.

Although the present invention has been described in connection with a particular embodiment thereof, it is to be understood that additional embodiments, modifications, and applications thereof which will be obvious to those skilled in the art are included within the spirit and scope of the invention.

What I claim as being novel is:
1. A sampling time base, comprising:
   means for generating clock edges at a predetermined frequency;
   digital timing means for generating a digital delay signal substantially coincident with the Nth clock edge of a predetermined number N of clock edges, thereby establishing a digital timing interval from the first to the Nth clock edge;

analog timing means responsive to said digital delay signal for initiating an analog timing signal substantially coincident with said Nth clock edge; and means for generating a sampling pulse at the end of a predetermined analog timing interval of said analog timing signal.

2. A sampling time base in accordance with claim 1 wherein both said digital timing interval and said analog timing interval are programmable by a single logic control means.

3. A sampling time base in accordance with claim 2 wherein said logic control means comprises a microprocessor.

4. A sampling time base in accordance with claim 1 wherein said digital timing means comprises a programmable counter for counting said clock edges and producing said digital delay signal upon the last of a programmed number N of said clock edges.

5. A sampling time base in accordance with claim 4 wherein said programmable counter is activated upon receipt of a start signal.

6. A sampling time base in accordance with claim 1 wherein said analog timing means comprises linear ramp generating means initiated upon receipt of said digital delay signal.

7. A sampling time base in accordance with claim 6 wherein said sampling pulse generating means comprises comparison means receiving said linear ramp at one input thereof and a programmable voltage level at a second input thereof, said sampling pulse being generated by said comparison means when said linear ramp and said programmable voltage level are equal.

8. A signal sampling system, comprising:

a precision time delay generator having combined digital timing means and analog timing means for generating sampling pulses after consecutive digital and analog timing intervals, said digital timing means generating delay signals at predetermined counts of a clock signal and said analog timing means interpolating between said predetermined counts to produce said sampling pulses after combined digital and analog time delay with high temporal resolution;

means responsive to said sampling pulses for acquiring and storing samples of an input signal; and logic control means coupled to said precision delay generator for selecting time interval values for said digital timing means and said analog timing means.

9. A signal sampling system in accordance with claim 8 wherein said digital timing means comprises a programmable counter for counting edges of said clock signal, and said analog timing means comprises ramp generating means and a programmable voltage level for producing said sampling pulses.

10. A signal sampling system in accordance with claim 9 wherein said digital timing means produces a stimulus signal to initiate said input signal, wherein the combined digital and analog time delay represents the time interval between stimulus and a succeeding response.

11. A signal sampling system in accordance with claim 8 wherein said means responsive to said sampling pulses for acquiring and storing samples of an input signal comprises in combination a sampler, an analog-to-digital converter, and a digital memory.

12. A signal sampling system in accordance with claim 8 wherein said logic control means comprises a microprocessor.

* * * * *